United States Patent
Beyer

(10) Patent No.: US 9,559,024 B2
(45) Date of Patent: Jan. 31, 2017

(54) POWER SEMICONDUCTOR MODULE

(71) Applicant: ABB Schweiz AG, Baden (CH)

(72) Inventor: Harald Beyer, Lenzburg (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/921,587

(22) Filed: Oct. 23, 2015

(65) Prior Publication Data
US 2016/0043009 A1 Feb. 11, 2016

Related U.S. Application Data

(63) Continuation of application No. PCT/EP2014/051811, filed on Jan. 30, 2014.

(30) Foreign Application Priority Data

Apr. 26, 2013 (EP) .................... 13165536

(51) Int. Cl.
*H01L 21/66* (2006.01)
*H01L 23/34* (2006.01)
(Continued)

(52) U.S. Cl.
CPC ............. *H01L 22/30* (2013.01); *H01L 23/34* (2013.01); *H01L 25/165* (2013.01); *H01L 35/00* (2013.01);
(Continued)

(58) Field of Classification Search
CPC ........... H01L 23/62; H01L 2224/48137; H01L 2224/48227; H01L 2224/48901; H01L 25/16; H01L 25/115; G01K 11/22; G01K 11/265
See application file for complete search history.

(56) References Cited

U.S. PATENT DOCUMENTS

2004/0150529 A1* 8/2004 Benoit .................. G08C 23/04
340/679
2005/0285228 A1 12/2005 Sugawara
(Continued)

FOREIGN PATENT DOCUMENTS

| CN | 201708690 U | 1/2011 |
| DE | 102012216774 A1 | 3/2013 |

(Continued)

OTHER PUBLICATIONS

Simone Dalola, et al.: Characterization of Thermoelectric Modules for Powering Autonomous Sensors. IEEE Transactions on Instrumentation and Measurement, vol. 58, No. 1, Jan. 2009. pp. 99 to 107.

(Continued)

*Primary Examiner* — Karen Kusumakar
(74) *Attorney, Agent, or Firm* — Whitmyer IP Group LLC

(57) ABSTRACT

A power semiconductor module, including a housing and a substrate having at least one conductive path is located, at least one power semiconductor device arranged on said conductive path at least one contact, a self-sustaining system for detecting a physical parameter or a chemical substance, a device for wireless transmitting data provided by the sensor, and an energy source. The sensor detects at least one of current, voltage magnetic fields, mechanical stress, and humidity. The power semiconductor module may be part of an electronic device.

10 Claims, 1 Drawing Sheet

(51) Int. Cl.
   *H01L 35/00*    (2006.01)
   *H01L 25/16*    (2006.01)
   H01L 23/373    (2006.01)
   H01L 23/38     (2006.01)
(52) U.S. Cl.
   CPC ............ *H01L 23/3735* (2013.01); *H01L 23/38* (2013.01); *H01L 2924/0002* (2013.01)

(56) References Cited

U.S. PATENT DOCUMENTS

2011/0168223 A1* 7/2011 Dede ..................... H01L 23/38
                                                     136/205
2013/0077222 A1   3/2013 Sleven

FOREIGN PATENT DOCUMENTS

| EP | 1455391 A1  | 9/2004 |
| JP | 2003179230 A | 6/2003 |
| JP | 2004087871 A | 3/2004 |
| JP | 2006108256 A | 4/2006 |
| JP | 2008061375 A | 3/2008 |

OTHER PUBLICATIONS

European Search Report Application No. EP13165536.7 Completed: Sep. 6, 2013 9 pages.
International Preliminary Report on Patentability Application No. PCT/EP2014/051811 Completed: May 21, 2014 7 pages.
Nicholas S. Hudak, et al.: Small-Scale Energy Harvesting Through Thermoelectric, Vibration, and Radiofrequency Power Conversion. Journal of Applied Physics 103, 101301 (2008).

* cited by examiner

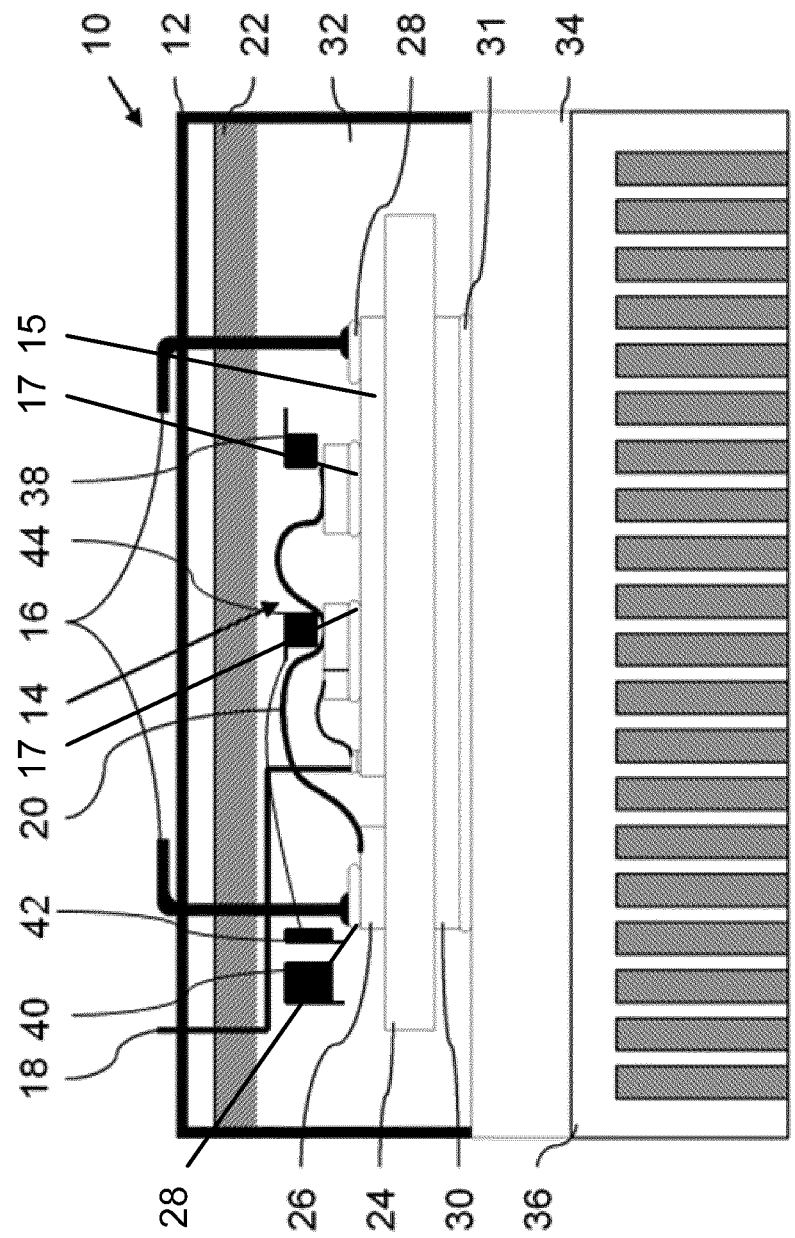

POWER SEMICONDUCTOR MODULE

FIELD OF THE INVENTION

The present invention relates to a power semiconductor module with the capability to provide a very safe and reliable performance. In particular, the invention relates to a power semiconductor module comprising a sensor system, the sensor system being designed in a self-sustaining manner.

BACKGROUND OF THE INVENTION

A variety of power semiconductor modules are known and used in many different electronic devices. A requirement of these power electronic modules is to provide a suitable reliability as well as security.

Power semiconductor modules may have lifetimes of up to thirty years in operation, for example for traction applications. Therefore, intensive qualification tests are required to qualify power modules according to these requirements. The detection of a plurality of parameters may thus be advantageous during qualification tests in order to better understand module behaviour and failure physics.

On the other hand, the supervision of physical parameters in power modules during operation may be used as a precursor for a failure and can therefore be used for further reliability diagnostics and prognostics. Therefore, critical modules may be removed and replaced before failure.

Known from DE 10 2012 216 774 A1, CN 201708690 U, JP 2004087871 A, and JP 2006108256 A is to provide a module with a sensor for detecting parameters of said module.

Further, known from US 2011/0168223 A1, JP2003179230 A, and JP 2008061375 is to provide a thermoelectric element for power harvesting in a module.

Further in "Small-scale energy harvesting through thermoelectric, vibration, and radiofrequency power conversion", N. S. Hudak et al, Journal of applied Physics, American Institute of Physics, vol. 103, 2008, an energy harvest device to harvest energy from sensors' environment is disclosed.

Moreover, EP 1 455 391 A1 discloses a semiconductor module with a housing and with a sensor element being arranged inside the housing, whereby the sensor element is a temperature sensor.

However, the reliability of power semiconductor modules still has potential for improvements.

SUMMARY OF THE INVENTION

It is therefore an object of the present invention to provide a power semiconductor module which allows an improved reliability, security and/or which is easy to manufacture.

This object is achieved by a power semiconductor module according to the invention. Preferred embodiments of the present invention are defined in the dependent claims.

The invention relates to a power semiconductor module, comprising a housing and a substrate, on which substrate at least one conductive path is located, further comprising at least one power semiconductor device being arranged inside the housing and being arranged on said conductive path and electrically connected hereto, and at least one contact for externally contacting said semiconductor device, wherein the module further comprises a self-sustaining sensor system being arranged inside the housing, the sensor system comprising a sensor for detecting a physical parameter or a chemical substance, a transmission device for wireless transmitting data provided by the sensor to a recipient outside the module, and an energy source for providing all required energy to the sensor system, whereby the sensor comprises at least one of a sensor for detecting current, voltage magnetic fields, mechanical stress, and humidity.

According to the invention, a power semiconductor module may be provided which allows an improved reliability and durability of the module as such, a module arrangement it may be part of and of an electronic device being equipped with such a power semiconductor module.

With regard to the power semiconductor module, the latter may comprise a substrate, on which substrate at least one conductive path is located, further comprising at least one power semiconductor device being arranged on said conductive path and electrically connected thereto. In detail a substrate may be provided with a first surface and a second surface being arranged opposite to the first surface. The substrate is at least partially electrically insulating, which particularly means that areas, or regions, respectively, of this substrate may be electrically insulating whereas further areas or regions, respectively, may not be electrically insulating but electrically conductive, such as formed by metallisation. Alternatively, the substrate may for example be completely electrically insulating in case it is formed from an electrically insulating material, such as AlN, $Si_3N_4$ or $Al_2O_3$.

In fact, a conductive path, or conductive structure, respectively, may be arranged at the first surface of the substrate, for example by providing a metallization as it is generally known. This may exemplarily mean that the conductive structure is formed on the surface of the substrate. This arrangement may for example be advantageous in case the substrate is fully electrically insulating and the conductive structure may thus be formed by depositing it, for example, as a structured metallisation, on the surface of the electrically insulating material of the substrate. Alternatively, the substrate as such may be formed in part electrically insulating and in part electrically conductive. Therefore, the electrically conductive areas, or positions, respectively, may as such form the first surface of the substrate, or at least a part thereof and particularly the electrically conductive structure.

The conductive path may essentially be provided at the first surface of the substrate in order to receive one or more power semiconductor devices as will be described down below. Further, at least one contact for externally contacting said semiconductor device is provided.

In detail, the at least one power semiconductor device is arranged on the above-described conductive path and is electrically connected thereto, as it is basically known from known power semiconductor modules. The semiconductor module may generally be provided as known in the art for power semiconductor modules, or power semiconductor arrangements, respectively. For example, the power semiconductor device may be an insulated gate bipolar transistor (IGBT), a reverse conductive insulated gate bipolar transistor (reverse conducting IGBT), bi-mode insulated gate transistor (BIGT) and/or a diode, such as a Schottky diode. Further and in order to let the power semiconductor module and thus the power semiconductor arrangement work properly, more than one semiconductor device may be present. For example, a plurality of the same or of different power semiconductor modules may be present. As a non-limiting example, an IGBT and a diode may be present in one module. The power semiconductor device may further be connected to the substrate, or the conductive path located thereon, respectively, by means of an adhesive having an appropriate electrical conductivity. For example, the semiconductor device may be fixed to the substrate, or its electrically conductive structure, respectively, by means of a solder. In particular, the first main contact of the semiconductor device, such as the emitter of an IGBT for example, may be fixed to the substrate, or an electrically conducting part thereof, whereas the second main contact of the semiconductor device, such as the collector of an IGBT, may be connected to a further location of the substrate and in particular to a further part of the electrically conductive structure, for example by means of a bond wire.

Further, the power semiconductor module comprises the self-sustaining sensor system. A self-sustaining sensor system may according to the present invention particularly mean a sensor system, which is autonomous, or autarkic, respectively, and may work on its own and does not require components of the module apart from the sensor system in order to work in the desired manner. Especially, no connections such as wire connections or plug connections to other parts of the module are provided in order to connect the sensor system with a device being not part of the sensor system. A self-sustaining sensor system is particularly a system which comprises all components which are required for respective measurements. These components, however, are not electrically integrated to any functional feature of the module. In other words, the sensor system is particularly not functionally integrated in functional components, such as particularly circuits, of the module. Further, the sensor system, or the respective parts thereof, are not integrated in order to achieve most possible effectiveness but in contrast thereto at positions which are chosen in order to not or at least not essentially negatively influence the functionality and the working process of the module.

The provision of a self-sustaining and thus fully autonomous sensor system allows a plurality of advantages.

One advantage may be seen in the fact that no wire connections or similar connections have to be required. This allows omitting a plurality of terminals for external sensors contacts, such as for an output signal, power supply, etc. Therefore, the manufacturing of such modules with self-sustaining sensor systems is significantly simplified. This in turn allows manufacturing such modules especially cost-saving. Further, due to the fact that additional electrical conductors which otherwise would potentially proceed from inside the module to its outside through additional through-holes in an enclosure of the module may be omitted, this further allows improving the reliability of the module due to the fact that additional positions at which outer atmosphere may potentially enter the module are prevented. As a result, further sealing measures may be omitted further allowing manufacturing a module according to the invention especially cost-saving.

Apart from that, due to the fact that the sensor system is formed autonomous, or self-sustaining, respectively, it may easily be introduced into known modules on demand, as no major rebuilding measures or exchange of several parts of the module are required. Therefore, the invention may be executed generally when manufacturing new modules as well as by adapting existing modules. The sensor system may thus be integrated without essentially influencing the working behaviour of the module.

Furthermore, it is not required and further not desired to integrate the sensor system into the control circuit of the module, for example of so called intelligent power modules. This further allows not to make such control circuits more complicated but in contrast thereto to use known control circuits, which in turn further simplifies the construction of such modules.

In order to achieve the above, the autonomous sensor system comprises a sensor for detecting a physical parameter or a chemical substance, or changes of the respective parameters. It is clear for one skilled in the art that the expression "a sensor" may as well comprise the provision of more than one sensor such as different sensors or comparable or the same sensors. In fact, the exact amount of sensors may be adapted to the special use. The sensor may be seen as the heart of the sensor system as its object is to determine the desired parameter, such as particularly one or more of physical parameters, chemical substances, the parameters optionally being determined qualitatively and/or quantitatively. The sensor may generally be any sensor known in the art. Particularly, small sensors, such as based on resistivity or conductivity measurements, so called resistive sensors, capacitive sensors, potentiometric sensors or pyroelectric sensors may be preferred.

Additionally, the module, or the sensor system, respectively, comprises a transmission device for wireless transmitting data provided by the sensor to a recipient outside the module. For example, transmission units being based on bluetooth, W-Lan and the like, may be provided. This wireless transmission device is particularly connected to the sensor and may transmit the data provided by said sensor to a receiving device, or recipient, respectively, being positioned outside the module.

Apart from that, the sensor system comprises an energy source for providing all required energy to the sensor system. In other words, the sensor system comprises a device for energy harvesting, or for the generation of electric power required for sensor operation, respectively. For example, the energy source may provide energy to the sensor or particularly to the transmission unit. Therefore, the electrical energy required for a performance of the sensor system may be provided alone by said energy source. The energy source may be arranged according to the present requirements and applications. In fact each energy source which is adapted for delivering the required amount of energy may be used. However, preferred energy sources are those which may produce electric energy in-situ, or energy storage devices, such as batteries or a capacitor which may be charged contact-free.

The above described sensor system allows a supervision of the module at any time and independently from the state of the module as such. In other words, the sensor system may supervise the module in case the module as such is working or not. This generally allows in some embodiments supervision at any time. Such a supervision of the module regarding or physical parameters and/or chemical substances, for example, may act as a precursor for a failure and can further allow interfering in case a module has a failure or does not work properly. This significantly may enhance the security behaviour of a module and further may improve the durability as well as the reliability of the module. Accordingly, the durability as well as the reliability of a module arrangement comprising the module as well as of an electric device being equipped therewith may be enhanced.

Further, a test procedure of a module in order to qualify the module is especially improved.

The above description clearly shows that the sensor system is fully autonomous and thus does not require any electrical connection comprising wires or plugs to a device outside the module. Further, there is no need to integrate the sensor system into circuits of the module in order to work properly. Therefore, the power semiconductor module according to the invention allows an improved reliability and durability of the module as such, a module arrangement comprising such a module and of an electronic device being equipped with such a power semiconductor module. It is thereby a benefit of the inventors to provide a power semiconductor module with a fully autonomous sensor system by combining several approaches which have never been made before and to achieve the inventive effect providing the advantages as described above.

According to an embodiment, at least one sensor, for example a plurality of the sensors present, preferably all provided sensors, is designed for an electrically contact-free measurement. According to this embodiment, at least one sensor is designed such, that even during a respective measurement procedure, no electrical contact to current carrying parts of the module apart from the sensor system is provided. This embodiment allows the respective sensor to detect the respective physical parameters, or chemical substances, for example, without influencing the working behaviour of the module. According to this, the module may work in the desired manner without being negatively influenced, for example with respect to efficiency or precision.

According to a further embodiment, the sensor system is free of any electric contact to current carrying parts of the module, and thus in particular of components of the module apart from the sensor system. Again, this shall in particular mean that the respective parts of the module do not carry any current during the measurement of the sensor or especially at all. According to this embodiment, not only the respective sensors with respect to their measuring behaviour, but the whole sensor system thus works completely without being electrically connected to the module as such, or of current carrying parts thereof, respectively. Pure mechanical contacts, however, may be provided. Therefore, it becomes especially clear that the sensor system is no standard part of the power electronic module and is thus not integrated into any electrical circuitry of the power module. This especially allows mounting parts of the sensor system optionally inside the power module on demand and thus adapting the components of the sensor system without changing any component of the module as such. In other words, in case a further sensor should be incorporated into an existing system, even in case the power source as well has to be adapted, no influence on any circuitry of the module apart from the sensor system is required. In contrast thereto, the module as such may continue working without the requirement of major adaptions.

This embodiment thus allows mounting the sensor system or the respective parts thereof, respectively, on demand in a modular way in module qualification or for supervision of module operation. This therefore allows the integration of the sensor system into power modules as a modular part providing an optional feature in module application.

According to the invention, the sensor comprises at least one of a sensor for detecting temperature, current, voltage magnetic fields, mechanical stress, and humidity. When considering the above parameters, sensors are also included which detect a change of the respective parameters, such as a sensor for detecting temperature changes, for example a pyroelectric sensor. Especially the above-named physical parameters or substances may be important to consider in order to qualify the module or in order to supervise the performance of the module. The sensors may thereby be located inside the housing of the module at locations which are most relevant for the respective parameters to detect, such as to the corresponding parts to be supervised, and do not strictly have to be mounted close to each other. As exemplary and non-limiting examples, a sensor for detecting magnetic fields, such as a so-called Hall-effect sensor, may be located next to current conducting lines, such as power terminals. The same position may be appropriate for current sensors which may for example be current clamps in case of measurements free of electrical contacts. Sensors for humidity or chemical substances may be arranged on a substrate surface, next to a housing, or inside an insulating gel, such as silicon gel, optionally being provided from a module like generally known for one skilled in the art. Temperature change sensors, such as pyroelectrical sensors, may be localized on all places, where the temperature is a critical dimension, such as on a chip surface, on or in a solder material, for example by embedding the sensor therein, on the substrate surface, or on the baseplate. Sensors for mechanical stress may be embedded into solder material or positioned on encapsulation parts or other module parts exposed to mechanical impact.

When providing one or more of the above-named sensors, an especially improved security behaviour as well as reliability behaviour may be achieved.

According to a further embodiment, the power source comprises at least one of a thermoelectric device, a piezoelectric device, a pyroelectric device and a radiofrequency waves activated device. The afore-named power sources may be especially effective for an autonomous sensor system which particularly has no electrical contact to current carrying parts of the module. With this regard, energy sources may be provided which produce energy at any time and thus permanently, or those which are capable of generating electric power only in case it is required and thus on demand.

With respect to the thermoelectric element, or device, respectively, the latter takes advantage of the fact that in power electronic modules, temperature gradients appear which are well suitable for generating electric energy by means of the thermoelectric element. The thermoelectric element may thereby generally be located at any positions, where temperature differences can occur or can be used. Exemplary positions may in a non-limiting manner comprise positions in vicinity to the power semiconductor device, or the chip, respectively, and the substrate, in vicinity to the substrate and the baseplate, and between the power semiconductor device and a heatpipe. Possible positions preferably comprise those which are not integrated in the main thermal path of the module. A location in the main thermal path on the one hand facilitates optimum performance in power generation due to maximum temperature difference. However, mostly small temperature differences may be sufficient in order to provide the sensor system with a suitable amount of energy. Therefore, positions outside the main thermal path of the module may be appropriate allowing the further advantage according to which it is avoided that the thermal performance of the power module is reduced, due to the fact that materials for thermoelectrical applications mostly have a low thermal conductivity. Further, it may be avoided that the power source and thus the sensor system becomes a direct part of the power module. The main thermal path is thereby located directly between a semiconductor device, or a substrate, respectively, and a base plate. Positions lying aside said path may exemplarily be those, where the thermoelectric element is located on a surface of the semiconductor element but directed towards a direction opposite to a baseplate and thus, for example, directed towards and for example at least partly located inside a dielectric gel.

Further, the thermoelectric device may be coupled to a temperature bridge, which allows an especially free positioning of the thermoelectric element. For example, the thermoelectric element may be located on a contact, such as an emitter contact of a power semiconductor device, as hot side. The cold side may be formed from the silicon gel, or from the temperature bridge, which may be connected to the baseplate or any other comparably colder part and may be formed as a metal connection, for example.

Regarding the piezoelectric device, the latter may generate energy by means of vibrations. Accordingly, this embodiment may be especially advantageous with regard to mobile applications at which vibrations may occur, such as for traction applications. Due to the fact that under circumstances it may be hard to provide vibrations on demand, the energy source may, particularly according to this embodiment but as well generally, comprise or may be connected to an energy storage means which may be part of the sensor system.

The above-defined energy sources are thereby advantageous due to the fact that they are not only autonomous with respect to the module but do further not require any further component outside the module to work properly.

According to a further embodiment, a radiofrequency waves activated device is provided. Especially this embodiment is particularly suitable for generating energy on demand, for example in case data shall be provided from the sensor and shall be transmitted by the transmitter. This may be advantageous due to the fact that especially the transmitter and/or the sensor may require energy for working suitably which in turn allows not to generate energy in case the sensor and the transmitter are not required and are thus in an off-mode. The power generating device according to this embodiment may be mounted in vicinity, such as next to or on, encapsulation parts such as on a housing. According to this embodiment, a source of radiowaves may thus be located in the vicinity of the module and may for example be part of a module arrangement, or an electric device, equipped therewith.

Like stated above, especially the use of devices receiving radiofrequency from outside for generating electrical energy may particularly be activated in case of a demand of data reading. Therefore, energy may not be generated permanently, but only in case it is required.

According to a further embodiment, the sensor system further comprises a receiving unit for receiving data demands, the receiving unit being connected to at least one of the sensor and the transmission unit. According to this embodiment, the receiving unit may receive data demands transmitted by a transmitter located outside the module, such as by a part of a control unit of a module arrangement. The receiving unit may thus activate the sensor and/or the transmission unit of the sensor system in order to transmit data provided by the sensor. The transmitter outside the module may thereby be connected to or be a part of a control unit and may send a data demand in case the respective data are required. As a result, data are only provided in answer to a data demand which is received by the receiving unit and which may give a control operation to the transmitter. Thus, according to this embodiment no permanent transmittance of data is required. Therefore, this embodiment may allow an especially energy saving performance of the module because of which the energy source may be provided with small dimensions and with low requirements.

With respect to further technical features and advantages of the described power semiconductor module it is referred to the description of the module arrangement, the electrical device as well as to the FIGURE.

The invention further relates to a module arrangement, comprising at least one of the afore-described power semiconductor modules.

According to the invention it may thus be provided that the power module arrangement comprises only one power semiconductor module, or it may comprise more than one power semiconductor module. In a non-limiting example, the module arrangement may comprise two or more modules, such as in a non-limiting embodiment 2 to 6 power semiconductor modules may be provided in a power semiconductor module arrangement. Further, one or more of the above described features may be provided for one, or for a defined number of the present power semiconductor modules, wherein further semiconductor modules not having the described properties or being arranged differently may be present and comprised by the power semiconductor arrangement without leaving the scope of the present invention.

Therefore, a module arrangement may be provided which allows an improved reliability and durability of the module arrangement as such as well as of an electronic device being equipped with such a module arrangement.

According to an embodiment, the arrangement comprises a control unit being adapted for controlling the at least one power semiconductor module based on the data provided by at least one sensor. According to this embodiment, the control unit may optionally control the sensor or the transmission unit for example by means of a transmitter in order to send a control command to generate a data signal comprising data of one or more sensors. Further, the control unit may answer to critical data of the one or more sensors and may particularly control the provided one or more modules to which the sensor refers. For example, the control unit may start procedures in order to counteract situations which may be critical with respect to security or with respect to module damage. As an example, modules not working properly may be switched of, or in case of humidity being present inside the volume, a warning signal may be provided. For example, it may be indicated that an exchange of a module has to follow in order to prevent a failure. The control unit may further adapt the performance of the respective modules with regard to the data provided by the sensor system. As an example, in case high temperatures occur, the performance may be limited in order to counteract such a critical situation.

With respect to further technical features and advantages of the described module arrangement it is referred to the description of the power semiconductor module, the electrical device as well as to the FIGURE.

The present invention further refers to an electrical device, comprising a module or a module arrangement like described above. Such an electrical device has the particular advantage of a significantly improved working behaviour and further of a significantly improved reliability.

Examples for such electronic devices generally comprise all applications in the field of power electronics. Non-limiting examples comprise inverters, converters and the like, for example with respect to traction applications and in power plants. Power electronics thereby particularly may exemplary and typical refer to applications working with currents of more than approximately 74A and voltages of more than approximately 100V, the before named values being exemplary values only.

With respect to further technical features and advantages of the described electrical device it is referred to the description of the power module, the module arrangement as well as to the FIGURE.

BRIEF DESCRIPTION OF THE DRAWINGS

Additional features, characteristics and advantages of the subject-matter of the invention are disclosed in the subclaims, the FIGURE and the following description of the respective FIGURE and example, which—in an exemplary fashion—show one embodiment and example of a semiconductor module according to the invention.

In the FIGURE:

FIG. 1 shows a sectional side view of an embodiment of a module according to the invention.

DETAILED DESCRIPTION OF THE INVENTION

In FIG. 1, an arrangement of a power module 10 is schematically shown. In detail, the internal structure of said power module 10 is described. The power module 10 comprises a housing 12, such as a plastic casing, in which at least one power semiconductor device 14 is arranged. The semiconductor device 14 may in an exemplary manner be an insulated gate bipolar transistor (IGBT), a diode, a metal oxide semiconductor field-effect transistor (MOSFET), or the like. According to FIG. 1, a diode and an IGBT are provided. The semiconductor device 14 or the plurality of semiconductor devices 14 is connectable via contacts such as terminals 16, for example as connections to bus bars, and preferably via a gate terminal 18, wherein the semiconductor device 14 is preferably bonded by aluminium bond wires 20.

The semiconductor device 14 may further be arranged on a substrate 24. The substrate 24 may be formed in non-limiting examples as an aluminium nitride ceramic insulator or it may be formed of aluminium oxide or of silicon nitride. The semiconductor device 14 is further connected to the substrate via a conductive path 15, such as a metallization, and a solder 17. The terminals 16 as well as the auxiliary terminal, or gate terminal 18, respectively, are connected to the substrate 24 via a metallization 26, in particular a copper metallization, and a solder 28, or lot, respectively. However, comparable connections, such as ultrasonic welding, may be applied. Additionally, the substrate 24 is connected to a further metallization 30, in particular a copper metallization, at its bottom side. The remaining volume inside the housing 12 is filled e.g. with an insulating gel 32, such as silicon gel and a further isolator, such as a layer of epoxy 22 may be arranged in the housing 12, or it may be part of the housing 12.

During operation, a power module 10 generates thermal energy, or heat, respectively, due to the resistances in the electric conductors. Consequently, the generated heat has to be dissipated from the internal of the power module 10 to its outside. For this purpose, the power module 10 comprises a base plate 34. The base plate 34 is in thermal contact to the semiconductor device 14 on its upper side via the metallization 30 and a solder 31, and is furthermore thermally connected to a cooling fin, or heat sink 36, respectively.

The module 10 further comprises a self-sustaining sensor system, the sensor system comprising a sensor particularly for detecting a physical parameter or a chemical substance, a transmission device for wireless transmitting data provided by the sensor to a recipient outside the module, and an energy source for providing energy to the sensor system. The at least one sensor may be designed for an electrically contact-free measurement. Further, the sensor system may be free of any electric contact to current carrying parts of the module 10. The sensor preferably comprises at least one of a sensor for detecting temperature, current, voltage magnetic fields, mechanical stress, and humidity. According to FIG. 1, a temperature sensor 38 may be provided on the surface of a chip, or a semiconductor device 14, respectively, and a humidity sensor 40 is provided in the silicon gel 32. Further, a voltage magnetic fields sensor 42 may be provided in vicinity to a terminal 16, for example powered by a thermoelectric element 44 located on the surface of a power semiconductor device 14. Alternative power sources may comprise one of a pyroelectrical device, a piezoelectric device, and a radiofrequency waves activated device.

However, due to heat generation in power semiconductor modules 10, thermoelectric devices basing on the Seebeck-effect are a useful choice for power generation inside the module 10. A first side of the thermoelectric device 44 has to be placed on a hot, or at least comparably warm side and a second side of the thermoelectric element 44 is placed on a cold, or at least comparably cold side. In an autonomous sensor system, the device could be placed with the hot side on different locations such as hot places, for example on surfaces of the power semiconductor device 14, or on a substrate surface, and a comparably colder part may be located at or thermally connected to a cooler position, such as inside the insulating gel 32.

Apart from the above, the sensor system further may comprise a receiving unit for receiving data demands, the receiving unit being connected to at least one of the sensor and the transmission unit.

The data transmission based on data provided by the sensor may thereby occur actively, by permanently sending signals, or stimulated from the external recipient in the case of demand of data reading.

A module 10 like described above thus allows a flexible and low cost solution of sensor integration for supervision of qualification and operation of power semiconductor modules. The corresponding sensors are optionally mounted or introduced during module production, or thereafter. No major modification of the power module design is required.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A power semiconductor module, comprising:
   a housing,
   a substrate being arranged inside the housing,
   at least one conductive path located on the substrate,
   at least one power semiconductor device arranged inside the housing and arranged on said conductive path and electrically connected to said conductive path,
   at least one contact externally contacting said semiconductor device, and a self-sustaining sensor system arranged inside the housing, the sensor system having a sensor configured to detect a physical parameter and/or a chemical substance, a transmission device configured to wireless transmit data provided by the sensor to a recipient outside the module, and an energy source configured to provide all required energy to the sensor system, and wherein the sensor has at least one sensor configured to detect current, at least one sensor configured to detect voltage magnetic fields, at least one sensor configured to detect mechanical stress, and at least one sensor configured to detect humidity.

2. The module according to claim 1, wherein at least one of the at least one sensors is designed to provide an electrically contact-free measurement.

3. The module according to claim 1, wherein the sensor system is free of any electric contact to current carrying parts of the module.

4. The module according to claim 1 wherein the sensor further comprises at least one sensor configured to detect temperature.

5. The module according to claim 1, wherein the module comprises a power source and the power source includes at least one of a thermoelectric device, a piezoelectric device, a pyroelectric device, or a radiofrequency waves activated device.

6. The module according to claim 5, wherein the thermoelectric device is located aside a main temperature path of the module.

7. The module according to claim 1, wherein the sensor system further comprises a receiving unit configured to receive data demands, the receiving unit being connected to at least one of the at least one sensors and the transmission unit.

8. A module arrangement, comprising:
at least one power semiconductor having:
  a housing,
  a substrate being arranged inside the housing,
  at least one conductive path located on the substrate,
  at least one power semiconductor device arranged inside the housing and arranged on said conductive path and electrically connected to said conductive path,
  at least one contact externally contacting said semiconductor device, and
  a self-sustaining sensor system arranged inside the housing, the sensor system having a sensor configured to detect a physical parameter and/or a chemical substance, a transmission device configured to wireless transmit data provided by the sensor to a recipient outside the module, and an energy source configured to provide all required energy to the sensor system, and
  wherein the sensor has at least one sensor configured to detect current, at least one sensor configured to detect voltage magnetic fields, at least one sensor configured to detect mechanical stress, and at least one sensor configured to detect humidity.

9. The module arrangement according to claim 8, wherein the arrangement includes a control unit being configured to control the at least one power semiconductor module based on the data provided by the sensor.

10. An electrical device, comprising:
a module having a housing, a substrate being arranged inside the housing, and at least one conductive path located on the substrate,
said module further having:
  at least one power semiconductor device arranged inside the housing and arranged on said conductive path and electrically connected to said conductive path,
  at least one contact externally contacting said semiconductor device, and
  a self-sustaining sensor system arranged inside the housing, the sensor system having a sensor configured to detect a physical parameter and/or a chemical substance, a transmission device configured to wireless transmit data provided by the sensor to a recipient outside the module, and an energy source configured to provide all required energy to the sensor system, and
  wherein the sensor has at least one sensor configured to detect current, at least one sensor configured to detect voltage magnetic fields, at least one sensor configured to detect mechanical stress, and at least one sensor configured to detect humidity.

* * * * *